United States Patent
Lee et al.

(10) Patent No.: US 7,875,525 B2
(45) Date of Patent: Jan. 25, 2011

(54) METHOD OF MANUFACTURING STACK-TYPE CAPACITOR AND SEMICONDUCTOR MEMORY DEVICE HAVING THE STACK-TYPE CAPACITOR

(75) Inventors: Jung-hyun Lee, Suwon-si (KR); Hion-suck Baik, Osan-si (KR); Soon-ho Kim, Seoul (KR); Jae-young Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 288 days.

(21) Appl. No.: 12/289,966

(22) Filed: Nov. 7, 2008

(65) Prior Publication Data

US 2009/0075450 A1 Mar. 19, 2009

Related U.S. Application Data

(62) Division of application No. 10/830,120, filed on Apr. 23, 2004, now abandoned.

(30) Foreign Application Priority Data

May 21, 2003 (KR) .................................. 2003-32255

(51) Int. Cl.
*H01L 21/20* (2006.01)
(52) U.S. Cl. ...................... 438/396; 438/557; 438/650; 438/686; 257/E21.351
(58) Field of Classification Search ........................ None
See application file for complete search history.

(56) References Cited

U.S. PATENT DOCUMENTS

| | | | |
|---|---|---|---|
| 5,918,118 A | 6/1999 | Kim et al. | |
| 5,998,824 A | 12/1999 | Lee | |
| 6,180,447 B1 | 1/2001 | Park et al. | |
| 6,472,269 B2 | 10/2002 | Kwak et al. | |
| 6,521,494 B2 | 2/2003 | Matsui et al. | |
| 6,720,604 B1 | 4/2004 | Fritzinger et al. | |
| 6,750,092 B2 | 6/2004 | Won et al. | |
| 6,815,221 B2 | 11/2004 | Kim et al. | |
| 2001/0054730 A1 | 12/2001 | Kim et al. | |
| 2002/0000598 A1 | 1/2002 | Kang et al. | |
| 2002/0004293 A1* | 1/2002 | Soininen et al. | 438/584 |
| 2002/0072191 A1 | 6/2002 | Aoki et al. | |
| 2002/0192896 A1* | 12/2002 | Matsui et al. | 438/239 |
| 2003/0057445 A1 | 3/2003 | Kweon et al. | |
| 2004/0087085 A1 | 5/2004 | Lee et al. | |
| 2004/0232463 A1 | 11/2004 | Chung et al. | |
| 2006/0040444 A1 | 2/2006 | Lee et al. | |

FOREIGN PATENT DOCUMENTS

KR 10-2003-0055395 A 7/2003

* cited by examiner

*Primary Examiner*—Jarrett J Stark
(74) *Attorney, Agent, or Firm*—Lee & Morse P.C.

(57) ABSTRACT

A stack-type capacitor includes a lower electrode, a dielectric layer formed on the lower electrode, and an upper electrode formed on the dielectric layer, wherein the lower electrode includes a first metal layer having a cylindrical shape and a second metal layer filled in the first metal layer. In the capacitor, an amount of oxygen included in the lower electrode is decreased to suppress oxidation of a TiN layer. Thus, a stable stack-type capacitor may be formed, which increases greatly the performance of highly integrated DRAMs.

20 Claims, 9 Drawing Sheets

METHOD OF MANUFACTURING STACK-TYPE CAPACITOR AND SEMICONDUCTOR MEMORY DEVICE HAVING THE STACK-TYPE CAPACITOR

CROSS REFERENCE TO RELATED APPLICATION

This is a divisional application based on pending application Ser. No. 10/830,120, filed Apr. 23, 2004 now abandoned, the entire contents of which is hereby incorporated by reference.

BACKGROUND OF THE INVENTION

1. Field of the Invention

The present invention relates to a stack-type capacitor in which a lower electrode is formed of two different metal layers, a semiconductor memory device including the stack-type capacitor, and methods of manufacturing the capacitor and the semiconductor memory device.

2. Description of the Related Art

As the area occupied by a memory cell is scaled down, cell capacitance decreases. A decrease in the cell capacitance is typically a serious obstacle in increasing the integration density of dynamic random access memory (DRAM) devices. In a memory device, a decrease in the cell capacitance not only lowers the ability to read a memory cell and increases a soft error rate, but also hinders the operation of a device at a low voltage. Therefore, a method for increasing cell capacitance is needed for the manufacture of a highly integrated semiconductor memory device.

In order to increase a cell capacitance, cylindrical electrodes are used to increase the area of electrodes.

FIG. 1 illustrates a schematic cross-sectional view of a conventional cylindrical capacitor.

Referring to FIG. 1, an interlayer dielectric (ILD) 11 and an etch stop layer 12 are deposited on a substrate 20, and are patterned to form a contact hole 11a. The contact hole 11a is filled with a conductive plug 13. A lower electrode 14 is formed in a cylindrical shape over the conductive plug 13. A dielectric layer 15 and an upper electrode 16 are sequentially deposited on the lower electrode 14.

The electrodes of the cylindrical capacitor have increased areas, and the cylindrical capacitor has an improved capacitance. The prior art includes a method of manufacturing a cylindrical capacitor in which a hemispherical grain (HSG) is grown on an exposed portion of a cylindrical structure to increase the areas of electrodes.

However, in a highly integrated memory device using this conventional cylindrical capacitor, the inside of a hollow cylindrical structure is so narrow that inner walls may contact each other. To solve this problem, a filled cylindrical stack-type capacitor (hereinafter, referred to as a "stack-type capacitor") occupying a narrow area is required. Since the sectional area of the stack-type capacitor is smaller than that of a cylindrical capacitor, the integration density of a memory device may be improved.

FIG. 2 illustrates a cross-sectional view of a DRAM cell including a stack-type capacitor having a ruthenium (Ru) electrode.

Referring to FIG. 2, the DRAM cell includes a stack-type capacitor 40 and a switching transistor 30. The transistor 30 includes an n$^+$-type source region 21 and an n$^+$-type drain region 22, which are formed to be spaced apart from each other in a surface of a substrate 20 formed of p-type silicon. A gate insulating layer 31 and a gate electrode 32 are formed on the substrate 20 between the source region 21 and the drain region 22.

The stack-type capacitor 40 is formed on the transistor 30 via an interlayer dielectric (ILD) 33. To form the stack-type capacitor 40, a lower electrode 41, a dielectric layer 43, and an upper electrode 44 are sequentially stacked on the ILD 33. The lower electrode 41 and the upper electrode 44 are formed of ruthenium, and a dielectric material 42, such as $Ta_2O_5$, is filled in the lower electrode 41. The source region 21 of the transistor 30 is electrically connected to the lower electrode 41 of the capacitor 40 by a contact hole 33a formed in the ILD 33. The contact hole 33a is filled with a conductive plug 34 formed of polysilicon or tungsten. Also, a conductive barrier layer, e.g., a TiN layer 35, is formed between the conductive plug 34 and the lower electrode 41. The conductive barrier layer 35 is a diffusion barrier layer that prevents mutual diffusion or chemical reactions between the conductive plug 34 and the lower electrode 41. Although it is possible to use a TaN layer or a WN layer, the TiN layer 35 is generally used. The TiN layer 35 isolates the lower electrode 41 from the conductive plug 34, thereby preventing diffusion from the conductive plug 34 into the lower electrode 41 and exposure of the conductive plug 34 to oxygen during deposition. Reference numeral 45 denotes an etch stop layer to be described later.

This stack-type capacitor of FIG. 2, which takes up a smaller area than the conventional cylindrical capacitor of FIG. 1, is more appropriate for a highly integrated memory device.

FIGS. 3A through 3E illustrate cross-sectional views for showing a method of manufacturing a semiconductor memory device including the stack-type capacitor of FIG. 2.

A transistor 30 is formed on a semiconductor substrate 20 by a known semiconductor manufacturing method. Next, a first ILD 33 is formed on the semiconductor substrate 20. The first ILD 33 is selectively etched to form a contact hole 33a, which exposes a source region 21 of the transistor 30. The contact hole 33a is filled with a conductive plug 34 to connect the conductive plug 34 with the source region 21, as shown in FIG. 3A.

Thereafter, an insulating layer 36 is formed on the first ILD 33 to cover the conductive plug 34. The insulating layer 36 is selectively etched to expose the conductive plug 34. A TiN layer 35 is deposited by chemical vapor deposition (CVD) on the insulating layer 36 and then planarized by chemical mechanical polishing (CMP) until the insulating layer 36 and the TiN layer 35 are exposed, as shown in FIG. 3B.

Thereafter, a SiN etch stop layer 45 and a $SiO_2$ second ILD 46 are sequentially stacked on the insulating layer 36 and the TiN layer 35 and then etched by a dry etch process until a portion of the TiN layer 35 is exposed, thereby forming a via hole 46a. An electrode of the capacitor will be formed in the via hole 46a and on the portion of the TiN layer 35 exposed by the via hole 46a. Next, a conductive layer 41, e.g., a Ru layer, is formed by CVD to cover the entire surface of the TiN layer 35 exposed by the via hole 46a, and a $Ta_2O_5$ layer 42 is formed thereon (refer to FIG. 3C).

Next, the resultant structure is planarized by CMP until the second ILD 46 is exposed, and the second ILD 46 is etched by a HF wet etch process to form a stack-type lower electrode 41 (refer to FIG. 3D).

Next, a dielectric layer 43 and a Ru upper electrode 44 are sequentially formed on the lower electrode 41, and eventually a stack-type capacitor 40 is completed (refer to FIG. 3E).

However, in this method, when the lower electrode 41 is formed by depositing a Ru layer using CVD, since oxygen is used for a reaction gas, the TiN layer 35 connected to the lower electrode 41 is oxidized and thus volumetrically expands. The volumetric expansion of the TiN layer 35 causes a vacancy between the TiN layer 35 and the Ru lower electrode 41, as shown in the photograph of FIG. 4. Thus, the stack-type capacitor including the Ru lower electrode does not resist and collapses. As shown in FIG. 5, a photograph taken of a storage node shows that a capacitor leans toward and contacts the next capacitor. This degrades electrical properties of the capacitor, thus increasing leakage current.

SUMMARY OF THE INVENTION

In an effort to solve these and other problems, the present invention provides a stack-type capacitor including a lower electrode that is formed of two different metals and has improved physical properties and a semiconductor memory device having the same.

The present invention also provides methods of manufacturing the stack-type capacitor and the semiconductor memory device including the capacitor.

Accordingly, it is a feature of a first embodiment of the present invention to provide a stack-type capacitor including a lower electrode, a dielectric layer formed on the lower electrode, and an upper electrode formed on the dielectric layer, wherein the lower electrode includes a first metal layer having a cylindrical shape and a second metal layer filled in the first metal layer.

The first metal layer may be a ruthenium (Ru) layer and the second metal layer may be a nitride and aluminum layer. The nitride and aluminum layer may be a titanium aluminum nitride (TiAlN) layer or a tantalum aluminum nitride layer.

The upper electrode may be a ruthenium (Ru) layer.

It is another feature of an embodiment of the present invention to provide a semiconductor memory device including a stack-type capacitor, the device including a transistor and a capacitor, wherein the capacitor includes a lower electrode, a dielectric layer formed on the lower electrode, and an upper electrode formed on the dielectric layer, wherein the lower electrode includes a first metal layer having a cylindrical shape and a second metal layer filled in the first metal layer.

The transistor may be electrically connected to the capacitor by a conductive plug, and a diffusion barrier layer, i.e., a TiN layer, may be formed between the lower electrode and the conductive plug.

It is a third feature of an embodiment of the present invention to provide a method of manufacturing a stack-type capacitor, the method including (a) sequentially stacking an etch stop layer and an ILD on a substrate and forming a via hole by patterning the ILD and the etch stop layer, (b) sequentially forming a first metal layer and a second metal layer on the via hole and the ILD, (c) exposing the ILD, (d) forming a lower electrode formed of the first metal layer and the second metal layer by removing the ILD, and (e) sequentially depositing a dielectric layer and an upper electrode on the lower electrode, wherein the first metal layer is formed by atomic layer deposition.

The first metal layer may be formed of ruthenium and the second metal layer may be formed of titanium aluminum nitride or tantalum aluminum nitride. The upper electrode may be formed of ruthenium.

Step (b) may include absorbing a Ru precursor to a resultant structure of step (a), purging any remaining Ru precursor, decomposing the Ru precursor by absorbing an oxygen gas to the absorbed Ru precursor layer to form a ruthenium oxide layer, purging any remaining oxygen gas, and reducing the ruthenium oxide layer by supplying a hydrogen gas thereto.

Before absorbing the Ru precursor, the method may further comprise absorbing iodine (I), which is a halogen-series material, to the resultant structure of step (a).

It is a third feature of an embodiment of the present invention to provide a method of manufacturing a semiconductor memory device including a stack-type capacitor, the method including (a) forming a transistor on a substrate, (b) forming a first ILD on the substrate, (c) forming a contact hole in the first ILD to expose a predetermined region of the transistor, (d) forming a conductive plug in the contact hole, (e) forming an insulating layer on the first ILD, patterning the insulating layer until the conductive plug is exposed, and forming a diffusion barrier layer on the exposed portion, (f) sequentially stacking an etch stop layer and a second ILD on the first ILD and patterning the second ILD and the etch stop layer to expose the diffusion barrier layer (g) sequentially forming a first metal layer and a second metal layer on a resultant structure of step (f), (h) exposing the second ILD, (i) forming a lower electrode formed of the first metal layer and the second metal layer by removing the second ILD, and (j) sequentially depositing a dielectric layer and an upper electrode on the lower electrode, wherein the first metal layer is formed by atomic layer deposition.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
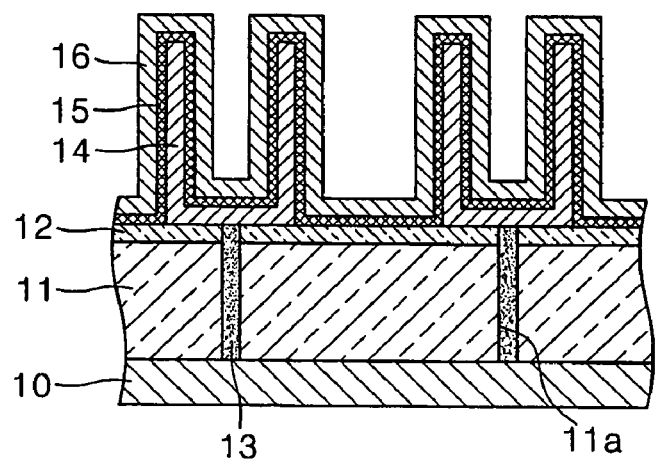
FIG. 1 illustrates a schematic cross-sectional view of a conventional cylindrical capacitor.
Figure 2:
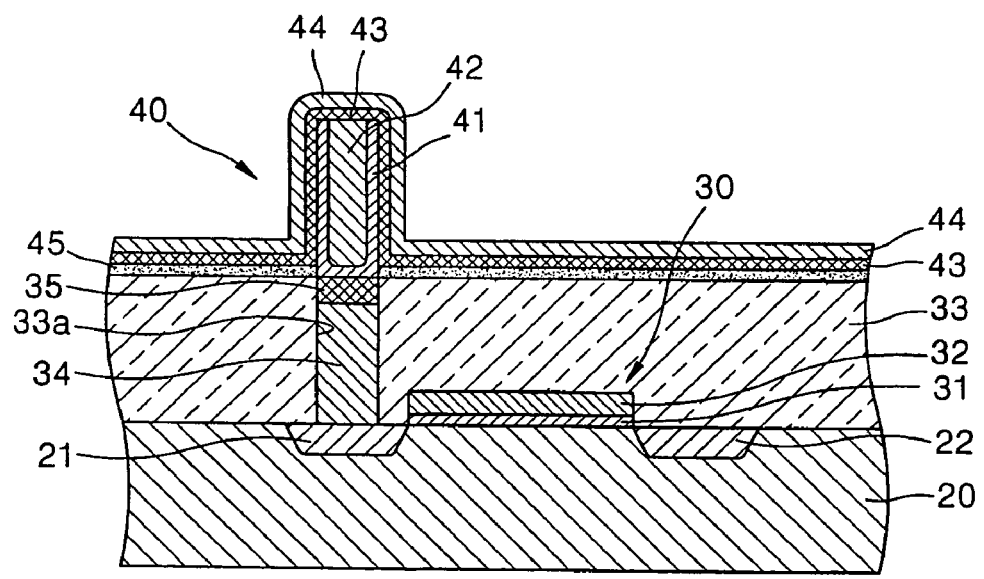
FIG. 2 illustrates a cross-sectional view of a DRAM cell including a stack-type capacitor having Ru electrodes.
Figure 3A:
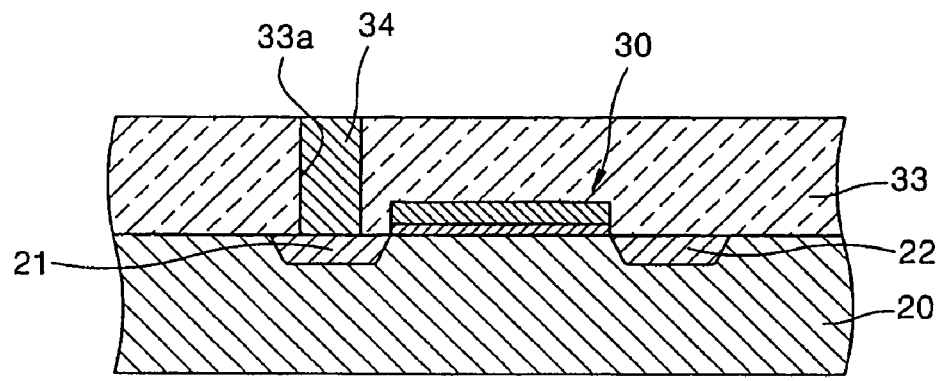
FIGS. 3A through 3E illustrate cross-sectional views for showing a method of manufacturing a semiconductor memory device including the stack-type capacitor as shown in FIG. 2.
Figure 3B:
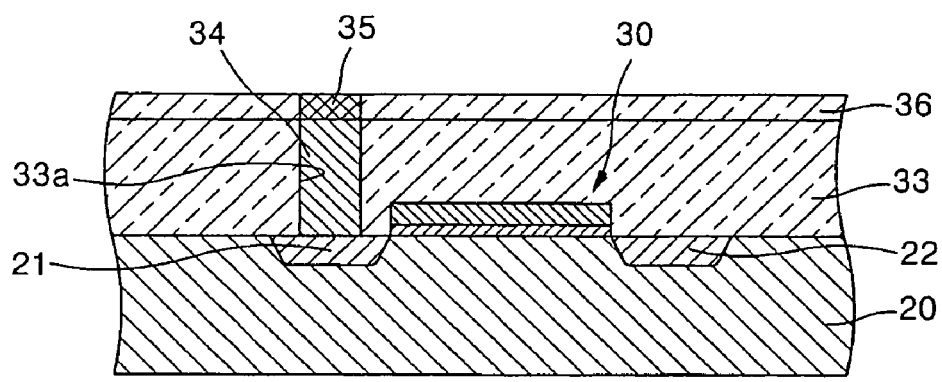
Figure 3C:
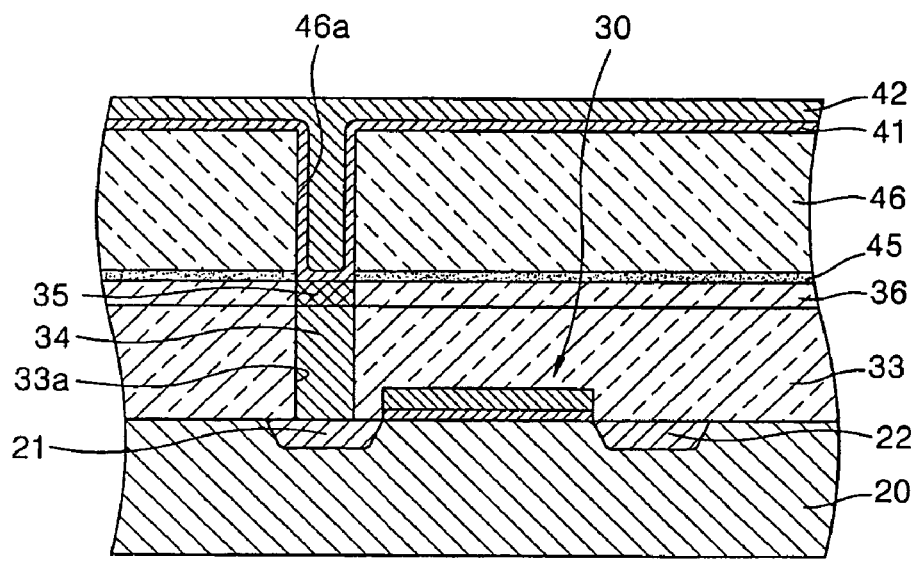
Figure 3D:
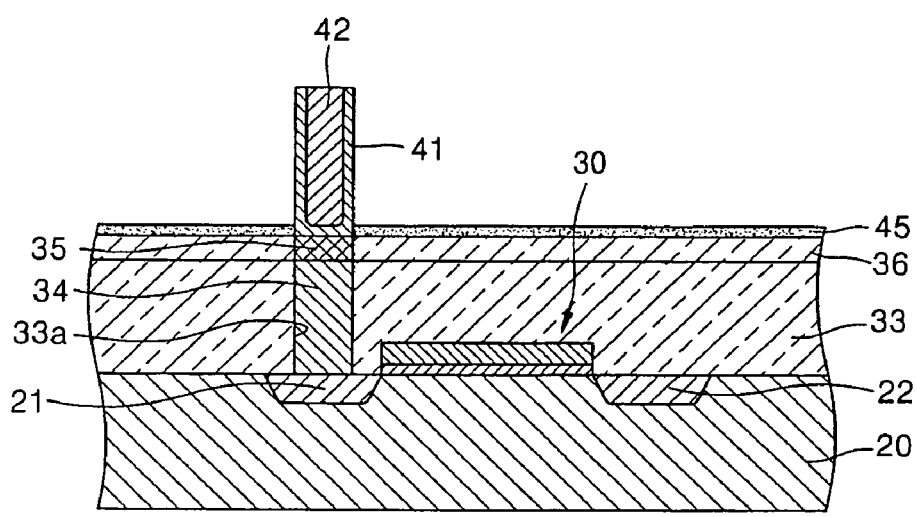
Figure 3E:
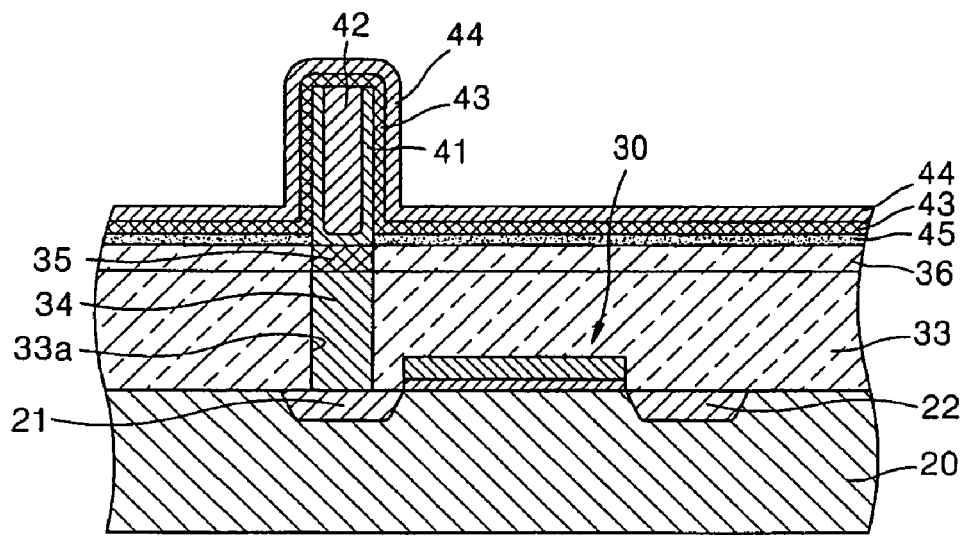
Figure 4:
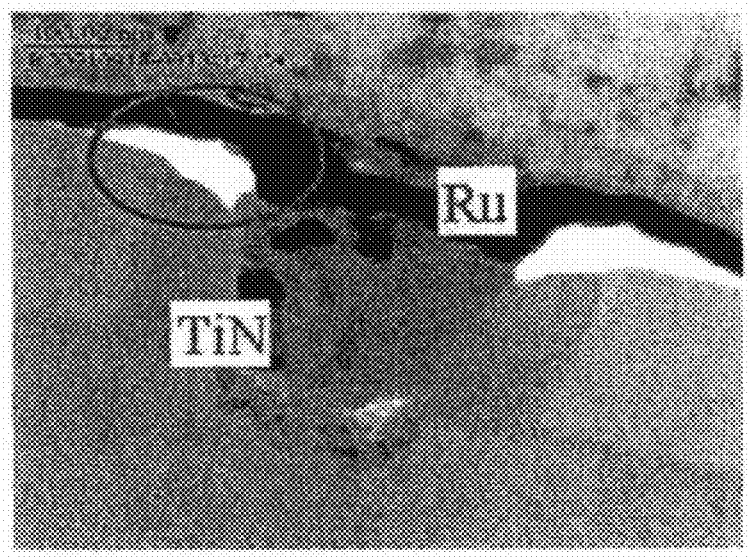
FIG. 4 is a microscopic photograph of a lower electrode including an oxidized TiN layer.
Figure 5:
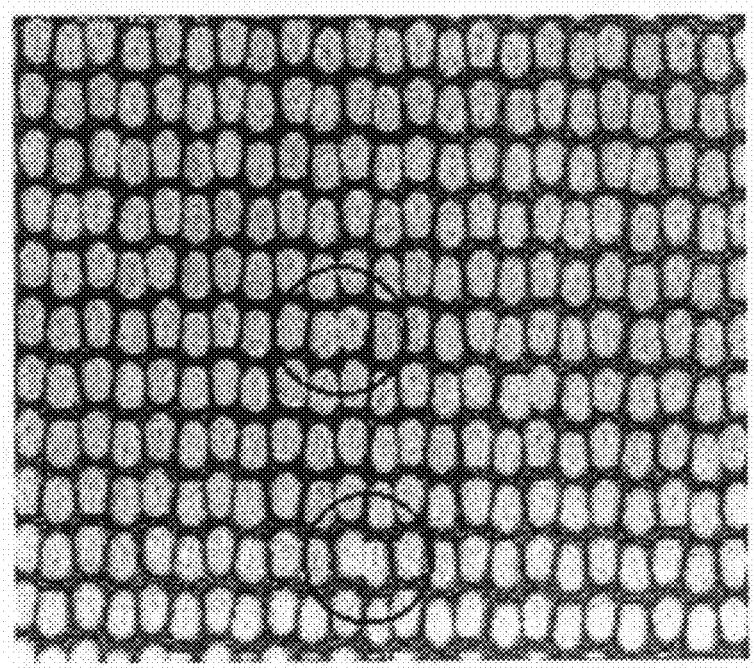
FIG. 5 is a microscopic photograph of a storage node in which a capacitor leans toward and contacts the next capacitor.

Korean Patent Application No. 2003-32255, filed on May 21, 2003, and entitled: "Stack-Type Capacitor, Semiconductor Memory Device Having The Same, And Methods Of Manufacturing The Capacitor And The Semiconductor Memory Device," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Figure 6:
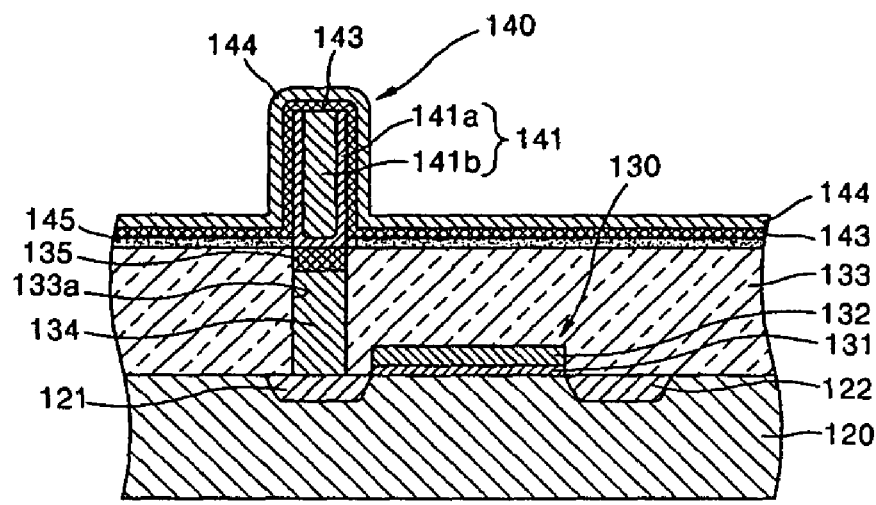
FIG. 6 illustrates a cross-sectional view of a DRAM cell including a stack-type capacitor according to an embodiment of the present invention.

FIG. 6 illustrates a cross-sectional view of a DRAM cell including a stack-type capacitor according to an embodiment of the present invention.

Referring to FIG. 6A, the memory device includes a stack-type capacitor 140 and a switching transistor 130. The transistor 130 includes an $n^+$-type source region 121 and an $n^+$-type drain region 122, which are formed to be spaced apart from each other on a substrate 120 formed of p-type silicon. A gate insulating layer 131 and a gate electrode 132 as a word line are formed on the substrate 120 between the source region 121 and the drain region 122.

A stack-type capacitor 140 is formed on the transistor 130 via a first interlayer dielectric (ILD) 133. In order to form the stack-type capacitor 140, a lower electrode 141, a dielectric layer 143, and an upper electrode 144 are sequentially stacked on the first ILD 133. The lower electrode 141 includes a cylindrical Ru layer 141a and a TiAlN layer (or a TaAlN layer) 141b filled in the Ru layer 141a. The upper electrode 144 is formed of Ru. The source region 121 of the transistor 130 is electrically connected to the lower electrode 141 of the capacitor 140 by a contact hole 133a formed in the first ILD 133. The contact hole 133a is filled with a conductive plug 134 formed of polysilicon or tungsten. Also, a conductive barrier layer, e.g., a TiN layer 135, which is a diffusion barrier layer preventing mutual diffusion or chemical reactions between different materials, is formed between the conductive plug 134 and the lower electrode 141. Although it is possible to use a TaN layer or a WN layer, the TiN layer 135 is generally used. The TiN layer 135 isolates the lower electrode 141 from the conductive plug 134, thereby preventing diffusion from the conductive plug 134 into the lower electrode 141 and exposure of the conductive plug 134 to oxygen during deposition. Reference numeral 145 denotes an etch stop layer.

Figure 7:
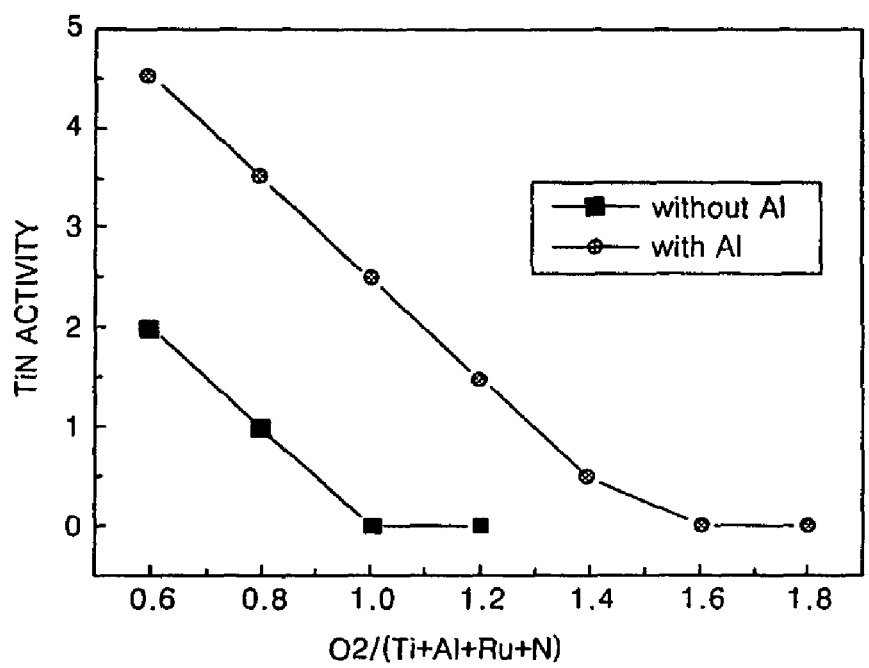
FIG. 7 illustrates a graph showing activity of TiN in an oxidized atmosphere depending on whether or not Al is added to TiN.

In the present invention, the lower electrode 141 is formed of TiAlN to solve structural instability of a capacitor due to oxidation of TiN 135. That is, as shown in FIG. 7, TiAlN shows a larger activity than TiN in an oxidized atmosphere. Since Al is oxidized earlier than TiN, a partial pressure of oxygen is lowered by the addition of the Al, and oxidation of the TiN is delayed. That is, Al leads a reduced amount of oxygen to react on TiN, thus suppressing oxidation of TiN.

Also, Ru for the lower electrode 141 is deposited by atomic layer deposition (ALD). The ALD process is a thin-film deposition technique using chemical absorption and desorption of a monatomic layer. In the ALD process, reactants are individually separated and supplied to a chamber in a pulsed mode such that the reactants are deposited on the surface of a substrate by chemical absorption and desorption due to a saturated surface reaction. Meanwhile, a halogen-series material, such as iodine (I), is firstly absorbed on a substrate, where a Ru layer is to be deposited, and then a Ru precursor is absorbed such that the iodine induces decomposition of the Ru precursor. Next, an oxygen gas is absorbed on the Ru precursor layer. Thus, a ligand of the Ru precursor reacts on oxygen and decomposes. The decomposed Ru is oxidized to generate ruthenium oxide. Next, hydrogen is absorbed on the resultant structure and reduces the ruthenium oxide, thereby removing oxygen included in Ru. As a result, oxidation between TiN and Ru, which is used for the lower electrode 141, may be suppressed.

FIGS. 8A through 8F illustrate cross-sectional views for showing a method of manufacturing a semiconductor memory device including the stack-type capacitor as shown in FIG. 6.

Figure 8A:
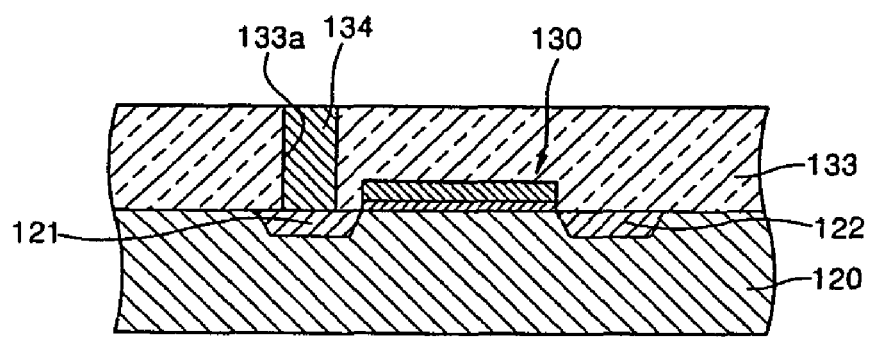
FIGS. 8A through 8F illustrate cross-sectional views for showing a method of manufacturing a semiconductor memory device including the stack-type capacitor as shown in FIG. 6.

A transistor 130 is formed on a semiconductor substrate 120 by a known semiconductor manufacturing method. Next, a first ILD 133 is formed on the semiconductor substrate 120. The first ILD 133 is selectively etched to form a contact hole 133a, thereby exposing a source region 121 of the transistor 130. Then, the contact hole 133a is filled with a conductive plug 134 to connect the conductive plug 134 with the source region 121 as shown in FIG. 8A.

Figure 8B:
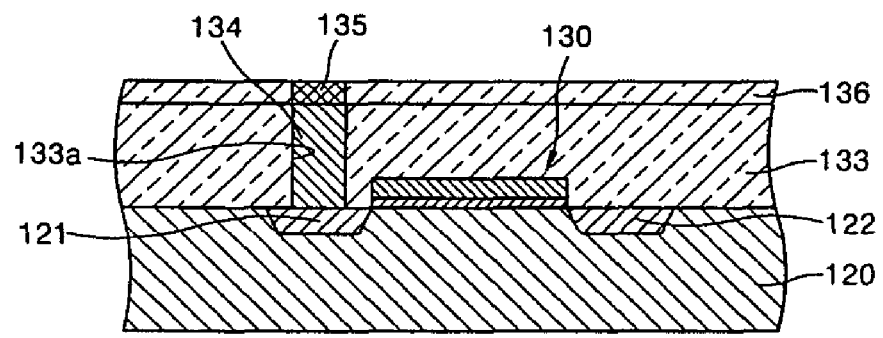

Thereafter, an insulating layer 136 is formed on the first ILD 133 to cover the conductive plug 134. The insulating layer 136 is selectively etched until the conductive plug 134 is exposed. Next, a TiN layer 135 is deposited by CVD on the insulating layer 136 and planarized by CMP until the insulating layer 136 is exposed, thereby forming the TiN layer 135 as illustrated in FIG. 8B.

Figure 8C:
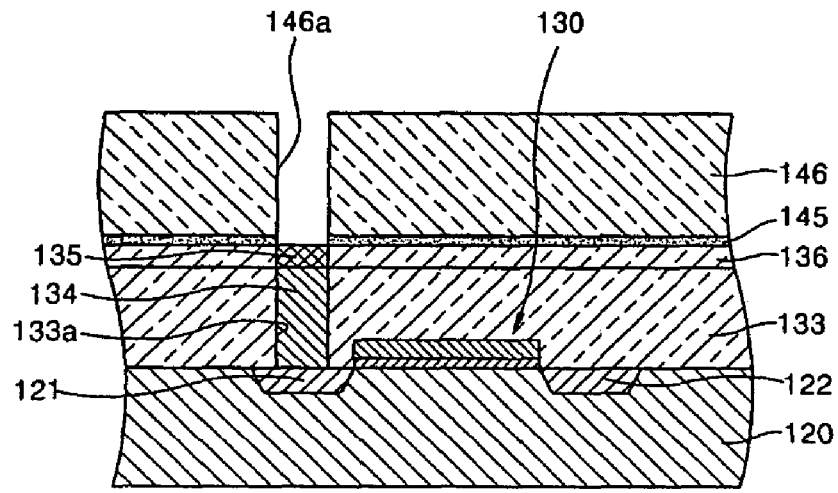

Thereafter, a SiN etch stop layer 145 and a $SiO_2$ second ILD 146 are sequentially stacked on the insulating layer 136 and the TiN layer 135. The SiN etch stop layer 145 and $SiO_2$ second ILD 146 are etched using a dry etch process until the TiN layer 135 is exposed, thereby forming a via hole 146a as shown in FIG. 8C. The via hole 146a exposes a region where a capacitor electrode will be formed.

A process of forming a Ru layer 141a for a lower electrode 141 on the via hole 146a using ALD will now be described. First, a halogen-series material, e.g., iodine, is absorbed on the insulating layer 146 and in the via hole 146a. The halogen-series material reacts on a Ru precursor, which will be used in a subsequent ALD process, and induces decomposition of the Ru precursor. The Ru precursor is absorbed on the entire surface of the insulating layer 146 where the iodine is absorbed, to cover the entire exposed surface of the TiN layer 135. Here, the iodine absorbed on the insulating layer 146 reacts on the Ru precursor and decomposes Ru from a ligand. Then, any remaining Ru precursor is purged. Next, an oxygen gas is absorbed on the Ru precursor layer. The oxygen gas reacts on the ligand of the Ru precursor and decomposes the Ru precursor, and the decomposed Ru reacts on oxygen, thus generating ruthenium oxide. Then, the oxygen gas is purged. Thereafter, a hydrogen gas is absorbed such that a reaction between oxygen and hydrogen occurs, thus generating water vapor. As a result, the amount of oxygen included in the ruthenium oxide is significantly decreased. By repeating the foregoing steps, the Ru layer 141a having a predetermined thickness is deposited on the via hole 146a and the second ILD 146.

Figure 8D:
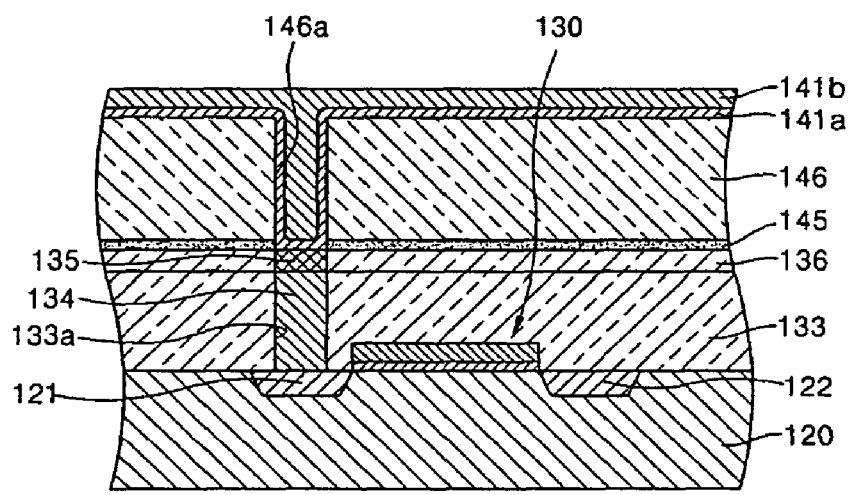

Thereafter, a TiAlN layer (or a TaAlN layer) 141b is deposited by CVD or ALD on the Ru layer 141a as shown in FIG. 8D.

Figure 8E:
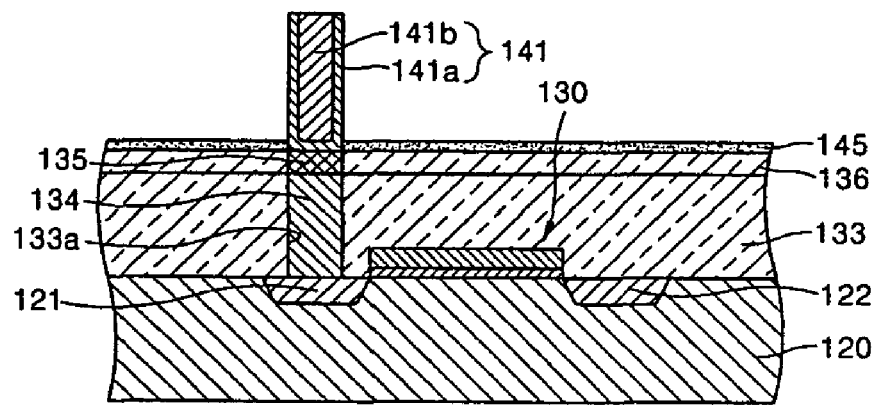

Next, the Ru layer 141a and the TIALN layer 141b are planarized by CMP until the insulating layer 146 is exposed. The second ILD 146 is etched using a HF wet etch process, thereby forming a stack-type lower electrode 141 as shown in FIG. 8E.

Figure 8F:
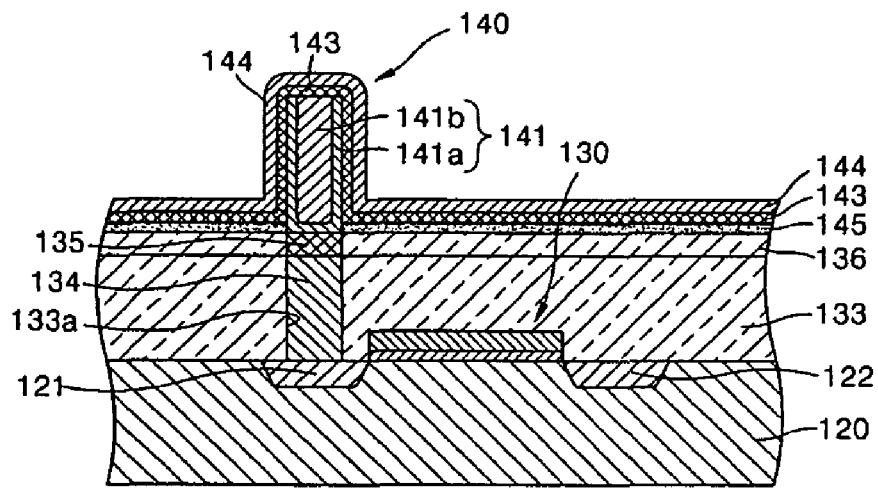

Next, a dielectric layer 143 and a Ru upper electrode layer 144 are sequentially formed on the lower electrode 141 and eventually a stack-type capacitor 140 is completed as shown in FIG. 8F. The dielectric layer 143 is formed of $HfO_2$, Ta, $TiO_2$, or BST.

As explained thus far, in the present invention, an amount of oxygen in a lower electrode is decreased, thereby suppressing oxidation of a TiN layer. Thus, a stable stack-type capacitor may be formed, which greatly increases the performance of highly integrated DRAMs.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a stack-type capacitor, the method comprising:
    (a) sequentially stacking an etch stop layer and an interlayer dielectric on a substrate and forming a via hole by patterning the interlayer dielectric and the etch stop layer, the via hole exposing a diffusion barrier layer formed on an underlying conductive plug;
    (b) sequentially forming a ruthenium first metal layer and a second metal layer in the via hole and on an upper surface of the interlayer dielectric, the first and second metal layers completely filling the via hole;
    (c) exposing the upper surface of the interlayer dielectric by removing the first and second metal layers formed thereon;
    (d) forming a lower electrode formed of the first metal layer and the second metal layer by removing the interlayer dielectric; and
    (e) sequentially depositing a dielectric layer and an upper electrode on the lower electrode,
    wherein the ruthenium first metal layer is formed by atomic layer deposition, and forming the first metal layer includes:
        (i) absorbing a halogen-series material to the resultant structure of (a) before absorbing a ruthenium precursor, the halogen-series material covering an entire exposed surface of the diffusion barrier layer;
        (ii) absorbing the ruthenium precursor on the interlayer dielectric and the diffusion barrier layer of a resultant structure of (a) to form a ruthenium precursor layer;
        (iii) purging any remaining ruthenium precursor;
        (iv) decomposing the ruthenium precursor by absorbing an oxygen gas to the ruthenium precursor layer to form a ruthenium oxide layer;
        (v) purging any remaining oxygen gas;
        (vi) reducing the ruthenium oxide layer by supplying a hydrogen gas thereto; and
        repeating steps (ii) to (vi) until the ruthenium first metal layer having a predetermined thickness is formed.

2. The method as claimed in claim 1, wherein the second metal layer is formed of titanium aluminum nitride or tantalum aluminum nitride.

3. The method as claimed in claim 2, wherein the upper electrode is formed of ruthenium.

4. The method as claimed in claim 1, wherein the halogen-series material is iodine.

5. The method as claimed in claim 1, wherein:
    the second metal layer has a greater reactivity towards oxygen than the diffusion barrier layer,
    the diffusion barrier layer is formed of a nitride, and
    the second metal layer is formed of nitride and aluminum.

6. The method as claimed in claim 1, wherein forming the first metal layer by atomic layer deposition includes sequentially forming a first precursor layer, forming a metal oxide in the precursor layer, suppressing oxidation of the diffusion barrier layer by reducing the metal oxide layer, and forming a second precursor layer.

7. The method as claimed in claim 1, wherein forming the first metal layer includes:
    (i) absorbing the halogen-series material on the interlayer dielectric and the diffusion barrier layer;
    (ii) forming the precursor layer by absorbing a precursor material on the halogen-series material, the halogen-series material decomposing the precursor material;
    (iii) purging any remaining precursor material;
    (iv) forming a metal oxide by absorbing an oxygen gas on the precursor layer;
    (v) purging any remaining oxygen gas;
    (vi) reducing the metal oxide by supplying a hydrogen gas thereto; and
    repeating steps (i) to (vi) until the first metal layer having a predetermined thickness is formed.

8. The method as claimed in claim 1, wherein:
    the second metal layer is formed in the via hole and on the upper surface of the interlayer dielectric prior to a planarization process of the first metal layer, the second metal layer being formed of titanium aluminum nitride or tantalum aluminum nitride, and
    the upper surface of the interlayer dielectric is exposed in step (d) by the planarization process.

9. The method as claimed in claim 8, wherein the first metal layer is a continuous layer covering the diffusion barrier layer in the via hole, covering the sidewalls of via hole, and being on the upper surface of the interlayer dielectric.

10. A method of manufacturing a semiconductor memory device including a stack-type capacitor, the method comprising:
    (a) forming a transistor on a substrate;
    (b) forming a first interlayer dielectric on the substrate;
    (c) forming a contact hole in the first interlayer dielectric to expose a predetermined region of the transistor;
    (d) forming a conductive plug in the contact hole;
    (e) forming an insulating layer on the first interlayer dielectric, patterning the insulating layer until the conductive plug is exposed, and forming a diffusion barrier layer on the exposed portion;
    (f) sequentially stacking an etch stop layer and a second interlayer dielectric on the first interlayer dielectric and patterning the second interlayer dielectric and the etch stop layer to expose the diffusion barrier layer through a via hole;
    (g) sequentially forming a ruthenium first metal layer and a second metal layer in the via hole and on an upper surface of the second interlayer dielectric of a resultant structure of (f), the first and second metal layers completely filling the via hole;
    (h) exposing the upper surface of the second interlayer dielectric by removing the first and second metal layers formed thereon;
    (i) forming a lower electrode formed of the first metal layer and the second metal layer by removing the second interlayer dielectric; and
    (j) sequentially depositing a dielectric layer and an upper electrode on the lower electrode,
    wherein the ruthenium first metal layer is formed by atomic layer deposition, and forming the first metal layer includes:
        (i) absorbing a halogen-series material to the resultant structure of (f) before absorbing a ruthenium precursor, the halogen-series material substantially covering an entire exposed surface of the diffusion barrier layer (ii) absorbing the ruthenium precursor on the second interlayer dielectric and the diffusion barrier layer of a resultant structure of (f) to form a ruthenium precursor layer;

(iii) purging any remaining ruthenium precursor;

(iv) decomposing the ruthenium precursor by absorbing an oxygen gas to the ruthenium precursor layer to form a ruthenium oxide layer;

(v) purging any remaining oxygen gas;

(vi) reducing the ruthenium oxide layer by supplying a hydrogen gas thereto; and repeating steps (ii) to (vi) until the ruthenium first metal layer having a predetermined thickness is formed.

11. The method as claimed in claim 10, wherein the second metal layer is formed of titanium aluminum nitride.

12. The method as claimed in claim 11, wherein the upper electrode is formed of ruthenium.

13. The method as claimed in claim 10, wherein the diffusion barrier layer is formed of titanium nitride.

14. The method as claimed in claim 10, wherein the halogen-series material is iodine.

15. The method as claimed in claim 10, wherein the first metal layer overlaps sidewalls of the via hole, and the second metal layer completely fills an area of the via hole defined by the first metal layer.

16. The method as claimed in claim 10, wherein:
the second metal layer has a greater reactivity towards oxygen than the diffusion barrier layer,
the diffusion barrier layer formed of a nitride, and
the second metal layer is formed of nitride and aluminum.

17. The method as claimed in claim 10, wherein forming the first metal layer by atomic layer deposition includes sequentially forming a first precursor layer, forming a metal oxide in the precursor layer, suppressing oxidation of the diffusion barrier layer by reducing the metal oxide layer, and forming a second precursor layer.

18. The method as claimed in claim 10, wherein forming the first metal layer includes:

(i) absorbing the halogen-series material on the second interlayer dielectric and the diffusion barrier layer;

(ii) forming the precursor layer by absorbing a precursor material on the halogen-series material, the halogen-series material decomposing the precursor material;

(iii) purging any remaining precursor material;

(iv) forming a metal oxide by absorbing an oxygen gas on the precursor layer;

(v) purging any remaining oxygen gas;

(vi) reducing the metal oxide by supplying a hydrogen gas thereto; and repeating steps (i) to (vi) until the first metal layer having a predetermined thickness is formed.

19. The method as claimed in claim 10, wherein:
the second metal layer is formed in the via hole and on the upper surface of the interlayer dielectric prior to a planarization process of the first metal layer, the second metal layer being formed of titanium aluminum nitride or tantalum aluminum nitride, and
the upper surface of the interlayer dielectric is exposed in step (h) by the planarization process.

20. The method as claimed in claim 19, wherein the first metal layer is a continuous layer covering the diffusion barrier layer in the via hole, covering the sidewalls of via hole, and being on the upper surface of the interlayer dielectric.

* * * * *